United States Patent
Kim et al.

(10) Patent No.: US 10,385,472 B2
(45) Date of Patent: Aug. 20, 2019

(54) CONTROL SYSTEM AND CONTROL METHOD FOR DIAMETER OF SINGLE CRYSTAL INGOT

(71) Applicant: LG SILTRON INC., Gumi-si, Gyeongsangbuk-do (KR)

(72) Inventors: Yun-Goo Kim, Gumi-si (KR); Gwang-Ha Na, Gumi-si (KR); Yun-Ha An, Gumi-si (KR)

(73) Assignee: SK Siltron Co., Ltd., Gyeongsangbuk (KR)

( * ) Notice: Subject to any disclaimer, the term of this patent is extended or adjusted under 35 U.S.C. 154(b) by 0 days.

(21) Appl. No.: 15/544,501

(22) PCT Filed: Dec. 31, 2015

(86) PCT No.: PCT/KR2015/014588
§ 371 (c)(1),
(2) Date: Jul. 18, 2017

(87) PCT Pub. No.: WO2016/117847
PCT Pub. Date: Jul. 28, 2016

(65) Prior Publication Data
US 2018/0171507 A1 Jun. 21, 2018

(30) Foreign Application Priority Data
Jan. 21, 2015 (KR) .......................... 10-2015-0009976

(51) Int. Cl.
*C30B 15/32* (2006.01)
*C30B 15/20* (2006.01)
(Continued)

(52) U.S. Cl.
CPC .............. *C30B 15/20* (2013.01); *C30B 15/30* (2013.01); *C30B 15/32* (2013.01); *C30B 29/06* (2013.01);
(Continued)

(58) Field of Classification Search
CPC .... C30B 15/30; C30B 15/32; Y10T 117/1072
See application file for complete search history.

(56) References Cited

U.S. PATENT DOCUMENTS

| | | | |
|---|---|---|---|
| 5,164,039 A | 11/1992 | Kawashima et al. | |
| 5,653,799 A | 8/1997 | Fuerhoff | |

(Continued)

FOREIGN PATENT DOCUMENTS

| | | |
|---|---|---|
| CN | 1056138 A | 11/1991 |
| CN | 1147570 A | 4/1997 |

(Continued)

OTHER PUBLICATIONS

International Search Report, corresponding to PCT/KR2015/014588, dated Jun. 22, 2016, 6 pages.
(Continued)

*Primary Examiner* — Matthew J Song
(74) *Attorney, Agent, or Firm* — Lewis Roca Rothgerber Christie LLP

(57) ABSTRACT

The embodiments of the present invention provides a diameter controlling system of the single crystal ingot for controlling a diameter deviation of a silicon ingot during the growth of silicon ingot by a Czochralski method, it may include a seed chuck for supporting a silicon ingot combined with a seed crystal and grown; a measuring part connected to an upper surface of the seed chuck with a cable and configured to measure a load applied to the seed chuck; a load adjusting part for moving a position of the seed chuck vertically while the seed chuck is connected to the cable to change a load applied to the silicon ingot; and a controlling part for controlling the load applied to the silicon ingot by driving the load adjusting part according to the load value measured from the measuring part. Therefore, shaking of the seed during the growth process of the single crystal ingot is (Continued)

prevented, and thus the diameter deviation of the growing single crystal ingot may be reduced.

9 Claims, 4 Drawing Sheets

(51) Int. Cl.
*C30B 29/06* (2006.01)
*C30B 15/30* (2006.01)
*C30B 35/00* (2006.01)

(52) U.S. Cl.
CPC ....... *C30B 35/007* (2013.01); *Y10T 117/1072* (2015.01)

(56) References Cited

U.S. PATENT DOCUMENTS

| | | | |
|---|---|---|---|
| 5,879,451 A | 3/1999 | Mizuishi | |
| 5,882,397 A * | 3/1999 | Iino | C30B 15/30 117/13 |
| 5,910,216 A * | 6/1999 | Nakamura | C30B 15/30 117/218 |
| 5,932,007 A * | 8/1999 | Li | C30B 15/30 117/208 |
| 5,935,325 A | 8/1999 | Tsuji et al. | |
| 6,217,648 B1 | 4/2001 | Shiraishi | |
| 6,726,764 B2 | 4/2004 | Mutti et al. | |
| 9,422,637 B2 | 8/2016 | Hong et al. | |
| 2012/0145071 A1 | 6/2012 | Hong et al. | |

FOREIGN PATENT DOCUMENTS

| | | |
|---|---|---|
| CN | 1396965 A | 2/2003 |
| EP | 2256234 A2 | 12/2010 |
| JP | 5-194082 A | 8/1993 |
| JP | 7-172980 | 7/1995 |
| JP | 9-175893 | 7/1997 |
| JP | 9-286693 | 11/1997 |
| JP | 10-251092 A | 9/1998 |
| JP | 2000-281485 | 10/2000 |
| KR | 2000-0068909 | 11/2000 |
| KR | 10-2012-0065768 A | 6/2012 |
| KR | 10-1218847 | 1/2013 |
| KR | 10-2013-0080653 | 7/2013 |

OTHER PUBLICATIONS

Korean Notice of Allowance, corresponding to KR 10-2015-0009976, dated Oct. 28, 2016, 2 pages.
Extended European Search Report dated Oct. 1, 2018 for corresponding EP Application No. 15879101.2 (3 pages).
CNIPA Office Action dated Dec. 5, 2018, for corresponding Chinese Application No. 201580074232.4 (5 pages).
Japanese Office Action dated Feb. 5, 2019 for corresponding JP Application No. 2017-538404 (3 pages).

* cited by examiner

CONTROL SYSTEM AND CONTROL METHOD FOR DIAMETER OF SINGLE CRYSTAL INGOT

CROSS-REFERENCE TO RELATED APPLICATION(S)

This application is a National Phase Patent Application and claims priority to and the benefit of International Application Number PCT/KR2015/014588, filed on Dec. 31, 2015, which claims priority to Korean Patent Application Number 10-2015-0009976, filed on Jan. 21, 2015, the entire contents of all of which are incorporated herein by reference.

TECHNICAL FIELD

The present invention relates to a diameter controlling system of a single crystal ingot, and more particularly, relates to a single crystal growing apparatus capable of uniformly controlling the diameter of the single crystal ingot by preventing a portion including a seed from shaking in the growth of the single crystal ingot using a Czochralski method.

BACKGROUND ART

In general, a silicon single crystal ingot in a silicon single crystal ingot growing apparatus is produced to be grown by dipping a seed, by using a pulling apparatus, into a silicon melt formed by melting polysilicon and a dopant in a quartz crucible, and rotating the seed and the quartz crucible in opposite direction while slowly pulling up the seed.

The silicon single crystal ingot growing apparatus is formed to include a quartz crucible in which a silicon melt is filled in a hot zone (H/Z) of an inside of a chamber, a graphite crucible for surrounding the quartz crucible, a support plate for supporting the crucible, a rotation shaft for coupling the support plate to an external rotation driving apparatus, a heater installed in a structure surrounding the crucible to radiate heat to the crucible, and a heat shielding member for preventing heat generated from the heater from radiating to the outside and lowering the temperature of the silicon melt.

A seed chuck is provided in the chamber. The seed chuck dips a seed connected to an external pulling up driving apparatus such as a drum with a cable into the silicon melt and then pulls up the seed at a predetermined speed, and supports the load of the silicon single crystal ingot which is growing at one end of the seed.

When the silicon ingot is grown by the Czochralski method as described above, the cable is connected to one end of the seed, and the ingot is grown by the rotation driving, so that the seed portion is particularly shaken.

FIG. 1 is a graph illustrating a diameter according to a growth length of a conventional single crystal ingot.

Referring to FIG. 1, a result of measuring the diameter of the grown silicon ingot by length is illustrated, wherein a deviation of the diameter of the silicon ingot in a region A which is the beginning of the ingot growth is larger than in a region B, and a change period also illustrates that the region A is shorter than the region B.

As described above, the shaking of the seed occurs due to the rapid increase of the pulling speed or the light weight of the initial ingot at the beginning of growing of the single crystal ingot, and this causes a diameter deviation of the grown ingot, which causes a problem in which the usable area of the grown single crystal is reduced.

DISCLOSURE

Technical Problem

The present invention is directed to solve the above problems and provide a controlling system of a silicon ingot capable of preventing a deviation of the diameter of an ingot to be grown due to shaking of the seed when the single crystal ingot is rotation-driven by a cable when the single crystal ingot is initially grown and a single crystal ingot growing apparatus including the same.

Technical Solution

An embodiment of the present invention provides a diameter controlling system of the single crystal ingot for controlling a diameter deviation of a silicon ingot during the growth of silicon ingot by a Czochralski method, it may include a seed chuck for supporting a silicon ingot combined with a seed crystal and grown; a measuring part connected to an upper surface of the seed chuck with a cable and configured to measure a load applied to the seed chuck; a load adjusting part for moving a position of the seed chuck vertically while the seed chuck is connected to the cable to change a load applied to the silicon ingot; and a controlling part for controlling the load applied to the silicon ingot by driving the load adjusting part according to the load value measured by the measuring part.

The load adjusting part of the embodiment may be formed as a linear motion (LM) guide for linearly raising or lowering a support unit coupled to a threaded surface of a lead screw in accordance with a rotation direction of the lead screw.

The load adjusting part of the embodiment is coupled to be fixed to the inside of a process chamber, and two or more load adjusting parts may be disposed so as to be connected to the seed chuck in directions opposite to each other. Also, a motor is provided on the lead screw, and the controlling part controls the rotation direction and rotation amount of the motor to adjust the position of the support unit.

In an embodiment, a body part which is formed in cylindrical shape to surround the seed chuck, and with a center portion formed to be penetrated, is included, and the support unit is coupled to the upper end portion of the body part and the position of the body part is changed by the upward or downward movement of the support unit, and the load applied to the seed chuck may be changed.

Also, a bearing is formed on a surface at which the seed chuck and the body part are in contact with each other, and thus the seed chuck is rotated, and an input part for setting a load target value of the user's target ingot is included, and the controlling part may set a load applied to the silicon ingot to a target value input to the input part.

Also, the target value may be set to a weight corresponding to the second half of the growth of the ingot in which the diameter deviation is relatively reduced with reference to the diameter deviation profile of the single crystal ingot grown in the previous run in the same growing apparatus.

In the embodiment, the controlling part may drive the load adjusting part until the target value is equal to the measured value by comparing the target value set by the user with the measured value of the load applied to the current silicon ingot.

An embodiment of the present invention provides a diameter controlling method of the single crystal ingot for controlling a diameter deviation of a silicon ingot when the silicon ingot is grown by a Czochralski method that may include a step of inputting a control target value for a load applied to the silicon ingot; a step of measuring a load applied to the current silicon ingot and deriving a measured value; and a step of comparing the target value and the measured value and changing a load applied to the silicon ingot so that the target value is equal to the measured value, and the step of changing the load applied to the silicon ingot may include a step of changing a position of the support unit connected to the seed chuck supporting the silicon ingot.

In the embodiment, a step of changing the load applied to the silicon ingot may include a step of moving the support unit connected to the seed chuck in a downward direction in the case in which the load applied to the silicon ingot is to be increased.

A step of changing the load applied to the silicon ingot in the embodiment may include a step of moving the support unit connected to the seed chuck upward direction in the case in which the load applied to the silicon ingot is to be reduced.

The step of moving the support unit connected to the seed chuck in the downward direction or the upward direction in the embodiment includes a step of rotating a motor provided at the upper portion of the support unit in a predetermined direction and moving the support unit in the vertical direction on the lead screw.

Advantageous Effects

In the present invention, since the shaking of the seed is prevented during the growing process of the single crystal ingot, the diameter deviation of the growing single crystal ingot can be reduced.

The present invention may prevent the seed portion from falling during the growth of the single crystal ingot due to the rapid pulling speed during the growing process of the single crystal ingot and it may prevent the uneven growth of the single crystal ingot by controlling the pulling speed.

BEST MODES FOR CARRYING OUT THE INVENTION

Hereinafter, embodiments will be described in detail with reference to the accompanying drawings. However, the present invention is not limited to the embodiments. In describing the embodiments of the present invention, detailed description of a known function or configuration may be omitted to clarify the gist of the present invention.

The single crystal growing apparatus according to the embodiment of the present invention as a growing apparatus capable of growing a single crystal ingot by applying an additional load to the seed chuck to which the seed is connected from the initial growing process of the single crystal ingot, and a method for controlling the growth condition while the seed is not shaken due to an increased weight of the single crystal ingot grown to some extent are proposed.

Figure 2:
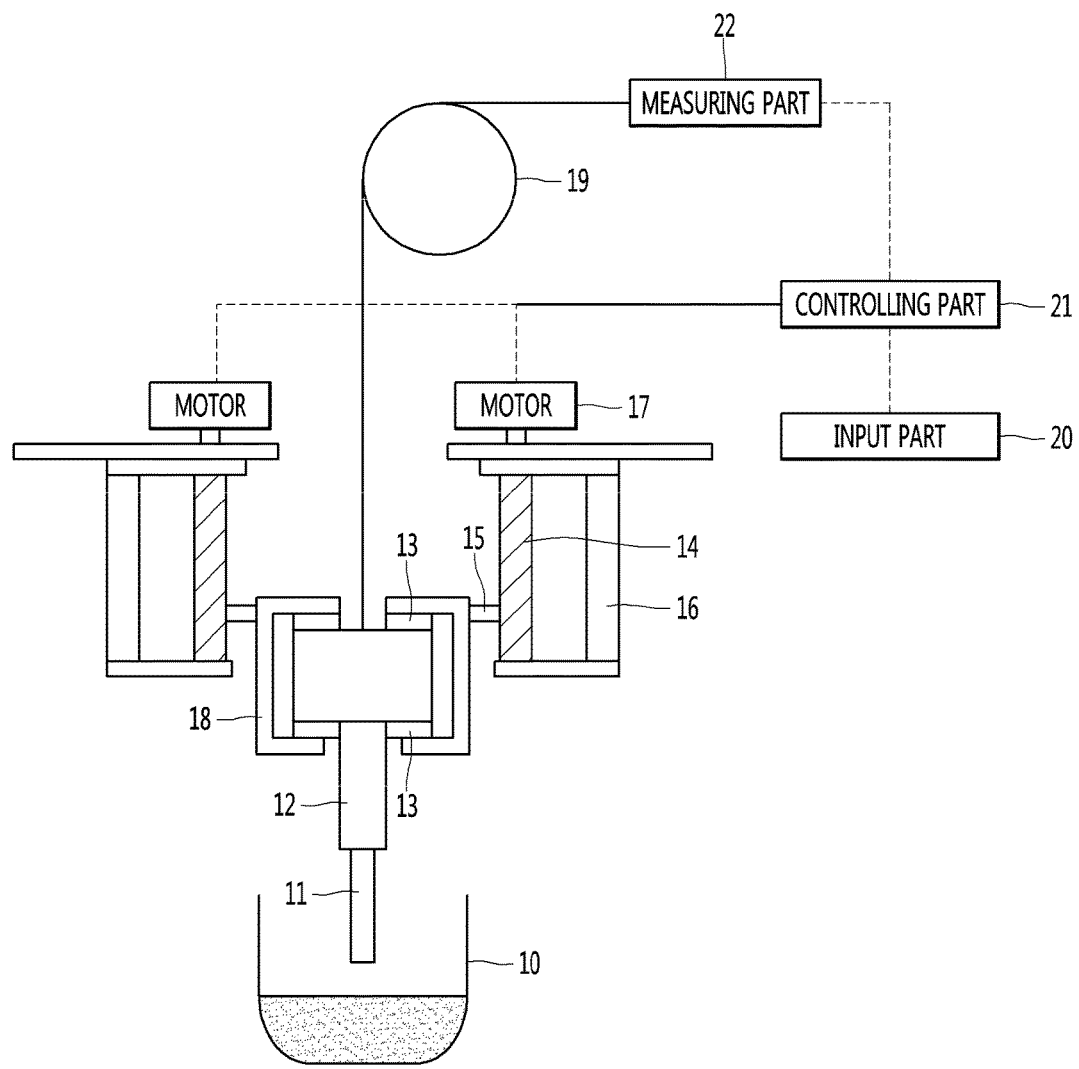
FIG. 2 is a cross-sectional view illustrating a single crystal ingot growing apparatus according to an embodiment of the present invention.

FIG. 2 is a cross-sectional view illustrating a single crystal ingot growing apparatus according to the present invention. Referring to FIG. 2, a configuration of a single crystal growing apparatus disposed in a process chamber is disclosed, but the process chamber is not shown and only a configuration in which the features of the present invention are revealed is shown.

The silicon ingot is grown by dipping a seed 11 which is a seed crystal into a silicon melt, and then pulling up the seed 11 while rotating at a constant speed. In order to dip the seed 11 into the silicon melt dissolved in a quartz crucible 10, a seed chuck 12 for fixing and supporting the seed 11 is provided, and a cable is connected to the upper surface of the seed chuck 12 so that the silicon ingot may be grown by pulling up the seed 11 from the silicon melt in accordance with the rotation of a rotation driver 19 such as a drum 19.

In the initial step of the growth of the silicon ingot, since the weight of the ingot including the seed is light, the shaking due to the driving of the cable occurs, and the deviation of the diameter greatly occurs depending on the length of the grown ingot by such shaking, but at the time of completion of the ingot growth, a portion including the seed does not shake due to the weight of the ingot, and the deviation of the diameter by length is remarkably reduced.

The present invention is directed to prevent the shaking of the region including the seed by setting the load transferred to the cable connected with the seed to be a load at the time when the ingot is completely grown, even during the initial growth of the ingot as described above. To this end, the present invention may include a part for controlling the load applied to the growing ingot and a part for applying or reducing the load applied to the single crystal ingot.

As a part for controlling the load applied to the single crystal ingot, an input part 20 for inputting a load value to be applied to the ingot by the user, a measuring part 22 for measuring the load applied to the currently growing single crystal ingot, and a controlling part 21 for controlling an operation for adding and subtracting a load to and from the single crystal ingot by comparing the value input to the input part 20 with a value measured from the measuring part 22 may be included.

Also, as a part for adding or reducing a load to the single crystal ingot, a cylindrical form body part 18 formed to surround the seed chuck 12 to which the seed is coupled and fixed, and a lead screw 14 coupled and fixed with a portion of an upper side surface of the body part 18 may be configured. The lead screw 14 is configured to be included in a load adjusting part 16, and the load adjusting part 16 may be formed as a linear motion guide for converting rotational motion into linear motion (LM).

At least one pair of lead screws 14 coupled to the body part 18 may be disposed at the upper portion of the process chamber in order to minimize the shaking of the body part 18 and may be disposed to face each other with the body part 18 interposed therebetween.

The lead screw 14 is a rod-shaped member having a threaded surface, and the threaded surface is coupled to a support unit 15 and a motor 17 is connected to the upper end.

Also, as the load adjusting part 16 is fixed to one surface of the process chamber, the position of the load adjusting part 16 may also be fixed.

In the embodiment, one end of the support unit 15 provided on the lead screw 14 is coupled to an upper surface of the body part 18. The lead screw 14 converts the rotational motion into the linear motion, and it may raise or lower the support unit 15 in accordance with the rotation direction of the motor 17 disposed on the upper surface. For example, in the case in which the motor 17 rotates in the counterclockwise direction CCW, since the support unit 15 linearly moves in an upward direction at the lead screw 14, the seed chuck 12 connected thereto is moved upward. On the other hand, in the case in which the motor 17 rotates in the clockwise direction CW, since the support unit 15 linearly moves in a downward direction at the lead screw 14, the seed chuck 12 connected thereto is moved downward.

The position of the seed chuck 12 and the body part 18 surrounding the seed chuck are changed by changing the position of the support unit 15, this means that the load applied to the silicon ingot is changed. In the present embodiment, the term "load" is defined as a weight applied to the silicon ingot.

That is, when describing the single crystal growing apparatus according to the embodiment in more detail, a seed by which the single crystal ingot is grown, a seed chuck coupled to support the seed, and a rotation driver for pulling up the seed chuck are provided, and a measuring part 22 which is a part for measuring the weight (load) of the current single crystal ingot is provided at one end of the rotation driver.

At both ends of the upper part of the process chamber, a pair of load adjusting parts 16 for fixing the position of the seed chuck on which the silicon ingot is to be grown or moving it in the vertical direction are provided, and the load adjusting parts 16 are coupled at two points of the upper surface portion of the body part 18 which is provided so that the lead screw 14 having a moving rail in a threaded surface in a diagonal direction and a support unit 15 capable of linear motion in the lead screw 14 surround the seed chuck 12.

That is, in the embodiment, in the case in which the support unit 15 is moved downward, the load is increased by pulling the cable connected to the silicon ingot, and in the case of moving upward, the load applied to the cable may be reduced.

Meanwhile, the growth of the silicon ingot is achieved by rotating the seed 11 through the rotation of the seed chuck 12. In order for the seed chuck 12 to rotate within the body part 18, at the upper and lower surfaces of the seed chuck 12, as a bearing 13 is provided in a region contacting the body part 18, the ingot is grown by reducing the interference when the seed chuck 12 is rotated.

The body part 18 supporting the seed chuck 12 according to the initial position of the seed is located at a certain distance from the silicon melt, and when the single crystal is grown by the rotation of the seed chuck 12, the growth is performed while pulling up the cable in the upward direction. The present invention is directed to apply a load as much as the weight of the ingot measured at a second half time point of the single crystal growth to the initial point in order to prevent shaking of the single crystal seed at the initial point of the growth of the single crystal, and the input part 20 and the controlling part 21 may be provided as a part of controlling the load applied to the single crystal ingot.

The input part 20 is a part for inputting a set value of the user, that is, a load value to be applied to the ingot at the present time by the user, and the controlling part 21 controls the movement of the cable so that the load value input by the input part 20 is maintained in the ingot, and controls the rotation of the motor 17 provided on the lead screw 14, so that the load set by the user is applied to the single crystal ingot. The controlling part 21 compares the load value of the current single crystal ingot with the set value of the user through the measuring part 22, and controls the load applied to the silicon ingot to be increased or decreased, and it may be performed by rotating the motor 17 in a predetermined direction to move the body part 18 upward or downward.

Figure 3:
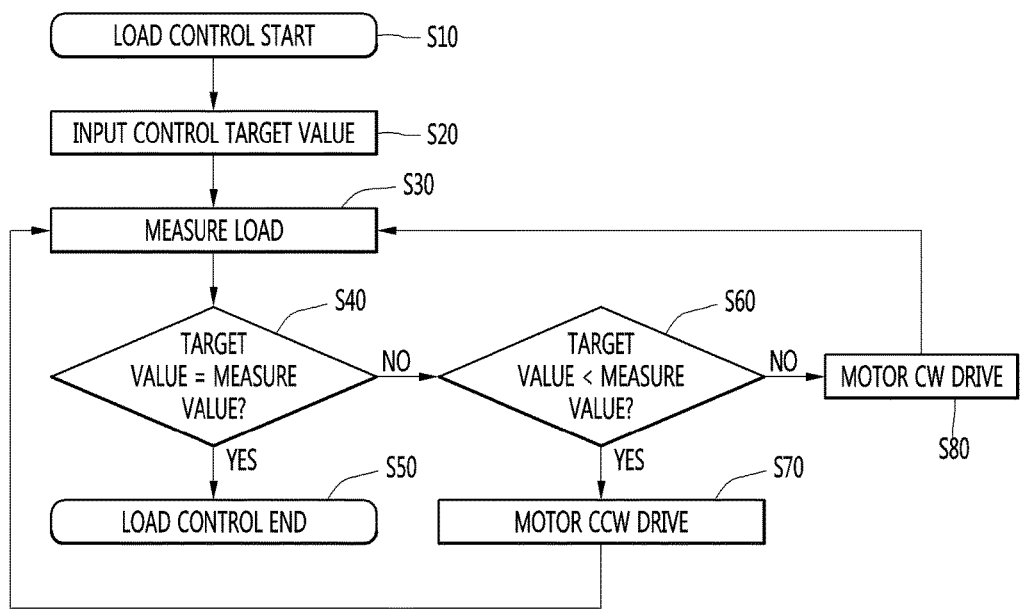
FIG. 3 is a view illustrating a flow of a single crystal ingot diameter controlling system according to an embodiment of the present invention.

FIG. 3 is a view illustrating a flow of a single crystal ingot diameter controlling system according to an embodiment of the present invention.

Referring to FIG. 3, in order to control the diameter deviation of the ingot during the initial growth of the silicon ingot, a process of controlling the load applied to the ingot by using the single crystal growing apparatus according to the embodiment is started (S10).

The user inputs a control target value which is a load value applied to the ingot in the growth step of the current silicon ingot to the input part (S20). The target value may be set to the weight of the ingot grown in the second half of the growth of the ingot, and may be set to the weight of the ingot in a section where the diameter deviation is reduced by referring to the diameter deviation profile of the single crystal ingot grown in the previous run in the same process apparatus. In the embodiment, the load of the ingot which is made of a target material is described as 300 kg for example.

Next, in the measuring part, a process of measuring the load applied to the current silicon ingot is performed (S30). The measurement of the load may be performed through a weight measuring sensor provided at one end of the cable connected to the silicon ingot.

The controlling part compares the measured value derived from the measuring part and the target value set by the user (S40). In the case in which the measured value and the target value are the same, the load control process is terminated (S50), and the growth of the single crystal ingot continues to be performed as the load applied to the current single crystal ingot.

If the target value is compared with the measured value and in the case in which the target value is indicated to be smaller than the measured value (S60), in order to reduce the load applied to the current silicon ingot, the support unit coupled to the body part surrounding the seed chuck is raised. Since the support unit is formed to linearly move in the vertical direction in accordance with the rotation direction of the motor provided on the lead screw, it is possible to raise the support unit by driving the motor provided on the lead screw to rotate in the counterclockwise direction (S70). Since the cable receives an upward force while supporting the single crystal ingot, the load applied to the single crystal ingot is reduced when the support unit is raised.

In the case in which the target value is indicated to be larger than the measured value by comparing the target value and the measured value, in order to increase the load applied to the current silicon ingot, the support unit coupled with the body part surrounding the seed chuck is lowered. The support unit may be lowered by driving the motor provided on the lead screw to rotate in the clockwise direction (S80). Since the cable receives an upward force while supporting the single crystal ingot, when the support unit is lowered, the load applied to the single crystal ingot is increased.

Therefore, by controlling the load applied to the ingot in the initial part of the growth of the silicon ingot, the load equal to the target value set by the user may be applied to the silicon ingot. That is, shaking of the seed during the growing process of the single crystal ingot is prevented, and the diameter deviation of the growing single crystal may be reduced.

Figure 4:
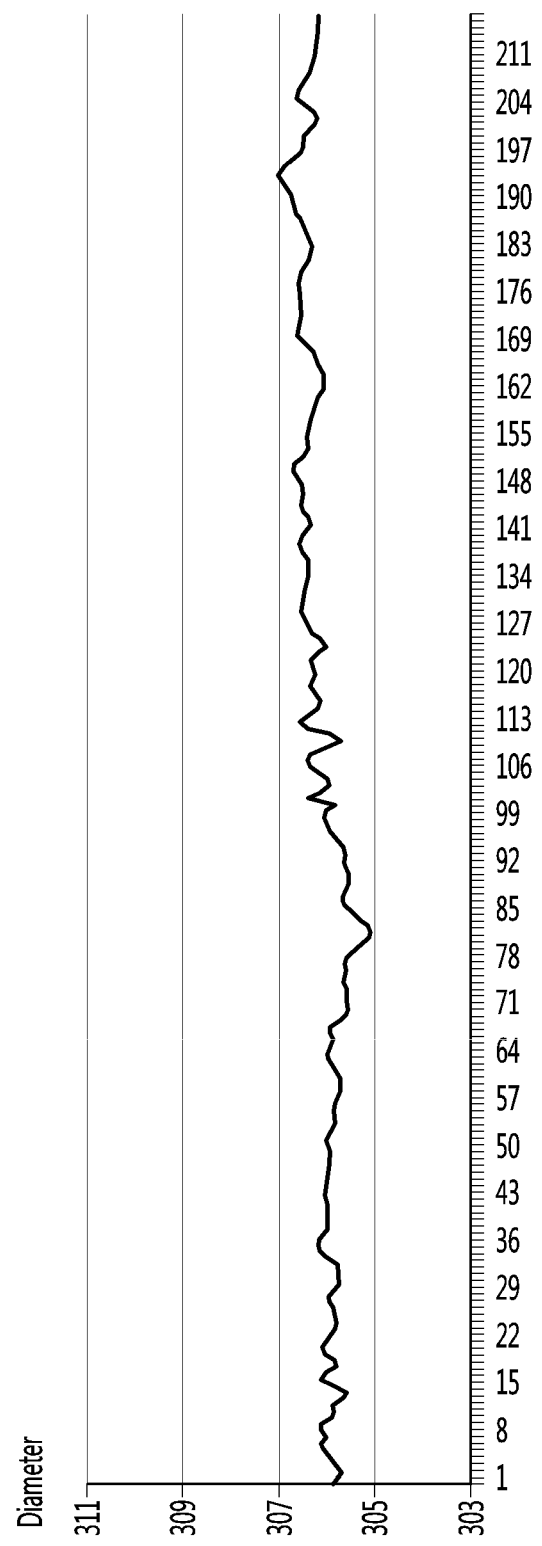
FIG. 4 is a graph illustrating a diameter according to a length of the grown ingot by the single crystal growing apparatus according to the embodiment of the present invention.

FIG. 4 is a graph illustrating a diameter according to a length of the grown ingot by the single crystal growing apparatus according to the embodiment of the present invention.

Figure 1:
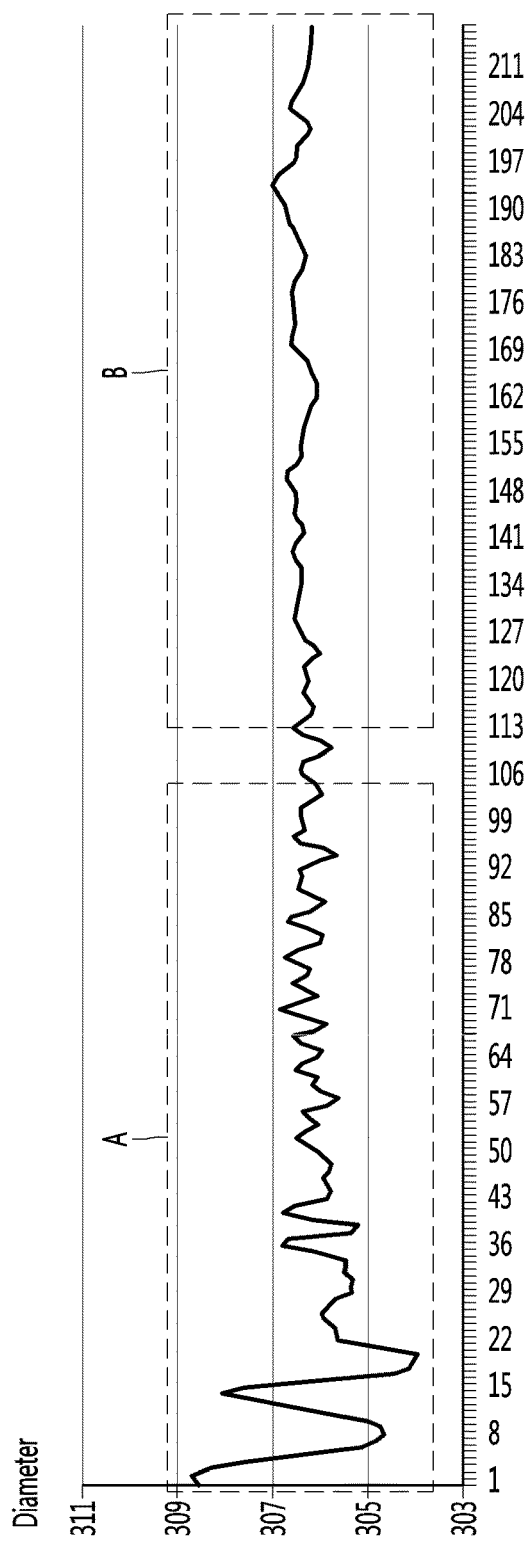
FIG. 1 is a graph illustrating a diameter according to a growth length of a conventional single crystal ingot.

Referring to FIG. 4, a diameter of the silicon ingot ranging from 305 to 307 mm, from the beginning to the end of the process, is shown, and it can be seen that the deviation of the diameter is about 2 mm. In FIG. 1, in particular, in comparison with a case in which the diameter deviation of the silicon ingot is 4 mm in the initial part of the ingot growth, it can be confirmed that the embodiment effectively reduces the diameter deviation of the single crystal ingot in the initial part of the ingot growth.

Also, since the present invention constantly controls the load applied to the ingot during the growing process of the single crystal ingot, the seed portion may be prevented from falling during the growth of the single crystal ingot due to the rapid pulling speed of the single crystal ingot, and the uneven growth of the single crystal ingot may be prevented by controlling the pulling speed.

Although embodiments have been mostly described above, they are only examples and do not limit the present invention and a person skilled in the art may appreciate that several variations and applications not presented above may be made without departing from the essential characteristics of the embodiments. For example, each of components described in detail in the embodiment may be implemented in a modifiable manner. Also, it should be construed that differences related to such variations and applications are included in the scope of the present invention defined in the appended claims.

INDUSTRIAL APPLICABILITY

In the embodiments, the single crystal ingot may be grown without shaking of the seed by changing the load applied to the seed in the initial growth of the seed into a load of a grown ingot to grow the silicon single crystal ingot, and thus the single crystal ingot in which the diameter deviation is controlled may be produced, which is industrially applicable.

The invention claimed is:

1. A diameter controlling system of a single crystal ingot as a system of controlling a diameter deviation of the silicon ingot during growth of the silicon ingot by a Czochralski method, the system comprising:
   a seed chuck configured to support a silicon ingot which is combined with a crystal seed and grown;
   a measuring part connected to the upper surface of the seed chuck with a cable and configured to measure a load applied to the seed chuck;
   a body part connected to surround the seed chuck;
   a load adjusting part configured to move a position of the body part vertically while the seed chuck is connected to the cable and change the load applied to the silicon ingot; and
   a controlling part configured to drive the load adjusting part according to a load value measured from the measuring part and control the load applied to the silicon ingot,
   wherein the load adjusting part includes a support unit coupled to an upper surface of the body part, a lead screw having a threaded surface coupled to the support unit, and a linear motion (LM) guide for linearly raising or lowering the support unit coupled to the lead screw in accordance with a rotation direction of the lead screw.

2. The system of claim 1, wherein the load adjusting part is coupled to be fixed in a process chamber, and two or more load adjusting parts are positioned so as to be connected to the seed chuck in directions opposite to each other.

3. The system of claim 1, wherein a motor is provided on an upper portion of the lead screw, and the controlling part adjusts a location of the support unit by controlling a rotation direction and an amount of rotation of the motor.

4. The system of claim 1, wherein the body part is formed in cylindrical shape to surround the seed chuck, and with a center portion formed to be penetrated.

5. The system of claim 4, wherein the support unit is coupled to the upper end portion of the body part and the position of the body part is changed by the upward or downward movement of the support unit, and the load applied to the seed chuck is changed.

6. The system of claim 4, wherein a bearing is formed on a surface at which the seed chuck and the body part are in contact with each other, and the seed chuck is rotated.

7. The system of claim 1, wherein an input part configured to set a target value of a target ingot load by the user is further included, and the controlling part sets a load applied to the silicon ingot to the target value input to the input part.

8. The system of claim 7, wherein the target value is set to a weight corresponding to the second half of the growth of the ingot in which the diameter deviation is relatively reduced with reference to the diameter deviation profile of the single crystal ingot grown in the previous run in the same ingot growing apparatus.

9. The system of claim 7, wherein the controlling part unit compares the target value which is set by the user and a measured value in the current silicon ingot and drives the load adjusting part until the target value is equal to the measured value.

* * * * *